(12) United States Patent
Fukunaga

(10) Patent No.: US 6,608,449 B2
(45) Date of Patent: Aug. 19, 2003

(54) LUMINESCENT APPARATUS AND METHOD OF MANUFACTURING THE SAME

(75) Inventor: Takeshi Fukunaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/851,656

(22) Filed: May 8, 2001

(65) Prior Publication Data

US 2001/0043046 A1 Nov. 22, 2001

(30) Foreign Application Priority Data

May 8, 2000 (JP) .......................................... 2000-135076

(51) Int. Cl.[7] .............................. G09G 3/10; H01J 1/62
(52) U.S. Cl. ..................... 315/169.3; 313/504; 313/506; 313/494
(58) Field of Search ........................... 315/169.3, 169.1; 313/494, 498, 504, 506, 512, 513, 116

(56) References Cited

U.S. PATENT DOCUMENTS

| | | | |
|---|---|---|---|
| 4,667,128 A | 5/1987 | Kamijo et al. ............... 313/505 |
| 5,300,858 A | * 4/1994 | Nikaido ....................... 313/503 |
| 5,739,545 A | 4/1998 | Guha et al. ................... 257/40 |
| 5,896,006 A | 4/1999 | Kusaka et al. ............... 313/506 |
| 5,910,706 A | 6/1999 | Stevens et al. .............. 313/498 |
| 5,929,561 A | 7/1999 | Kawami et al. ............. 313/506 |
| 5,969,474 A | * 10/1999 | Arai ............................. 313/504 |
| 6,039,896 A | * 3/2000 | Miyamoto et al. | |
| 6,140,766 A | * 10/2000 | Okada et al. ................ 313/506 |
| 6,185,032 B1 | * 2/2001 | Lee et al. ..................... 359/254 |
| 6,246,179 B1 | * 6/2001 | Yamada .................... 315/169.3 |
| 6,274,887 B1 | 8/2001 | Yamazaki et al. ............ 257/72 |
| 6,383,048 B1 | 5/2002 | Yang et al. .................. 445/24 |
| 6,406,802 B1 | 6/2002 | Arai et al. ................... 428/690 |
| 6,416,888 B1 | 7/2002 | Kawamura et al. ......... 428/690 |
| 2001/0011868 A1 | 8/2001 | Fukunaga et al. .......... 313/506 |

FOREIGN PATENT DOCUMENTS

| | | |
|---|---|---|
| EP | 0999595 A2 | 5/2001 |
| EP | 1122800 A2 | 8/2001 |
| JP | 11-339958 | 12/1999 |
| WO | WO 99/39393 | 8/1999 |

* cited by examiner

Primary Examiner—Don Wong
Assistant Examiner—Tuyet T. Vo
(74) Attorney, Agent, or Firm—Fish & Richardson P.C.

(57) ABSTRACT

The present invention provides a luminescent apparatus having a bright, high-quality image. A reflecting surface-including electrode, and an EL element formed of an organic EL layer and a transparent electrode are provided on an insulator. As shown in FIG. 1, an auxiliary electrode 107 formed of a transparent conductive film is connected to the transparent electrode via a conductor. This structure enables a resistance value of the transparent electrode 104 to be substantially lowered, and a uniform voltage to be applied to the organic EL layer.

21 Claims, 9 Drawing Sheets

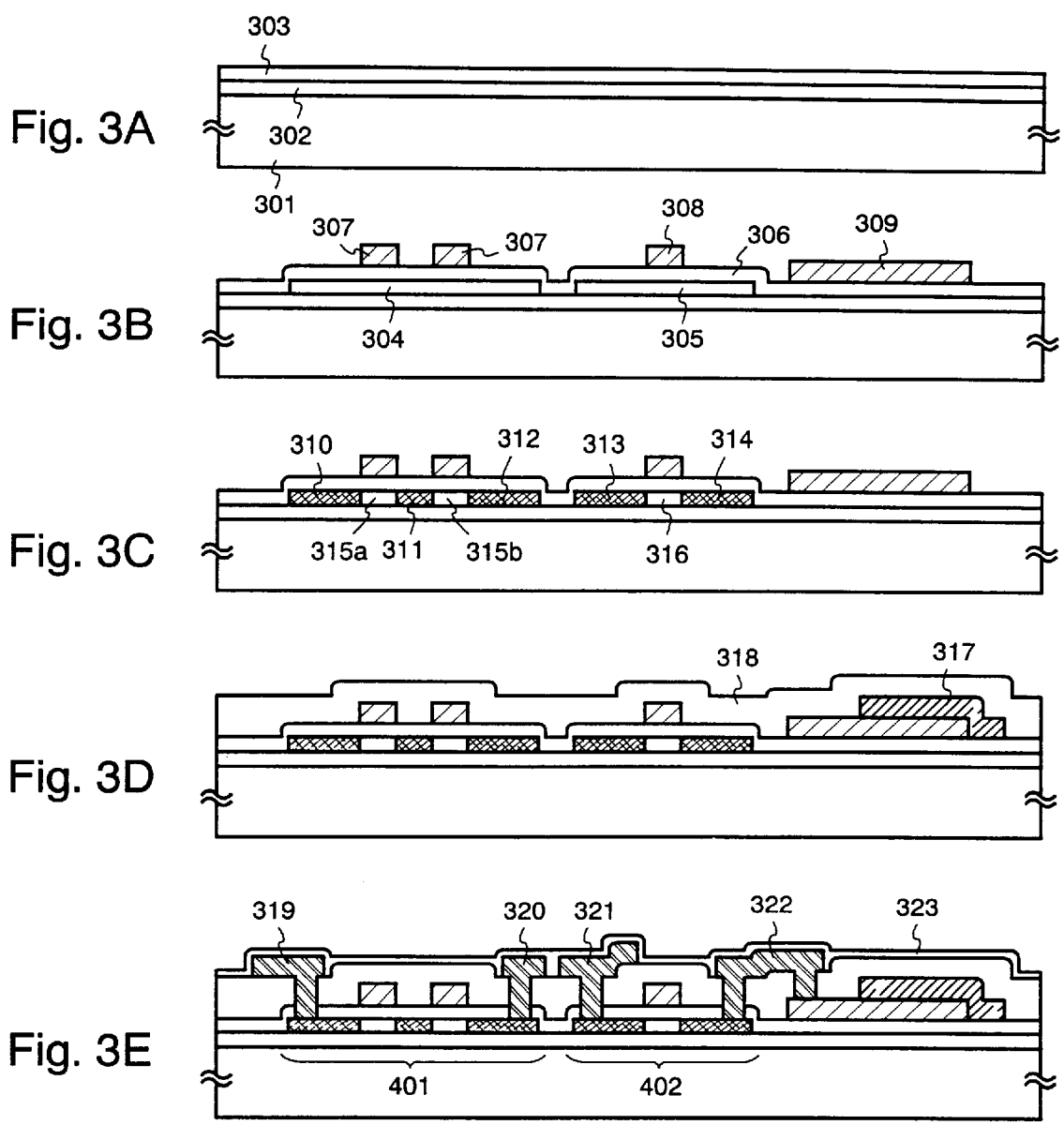

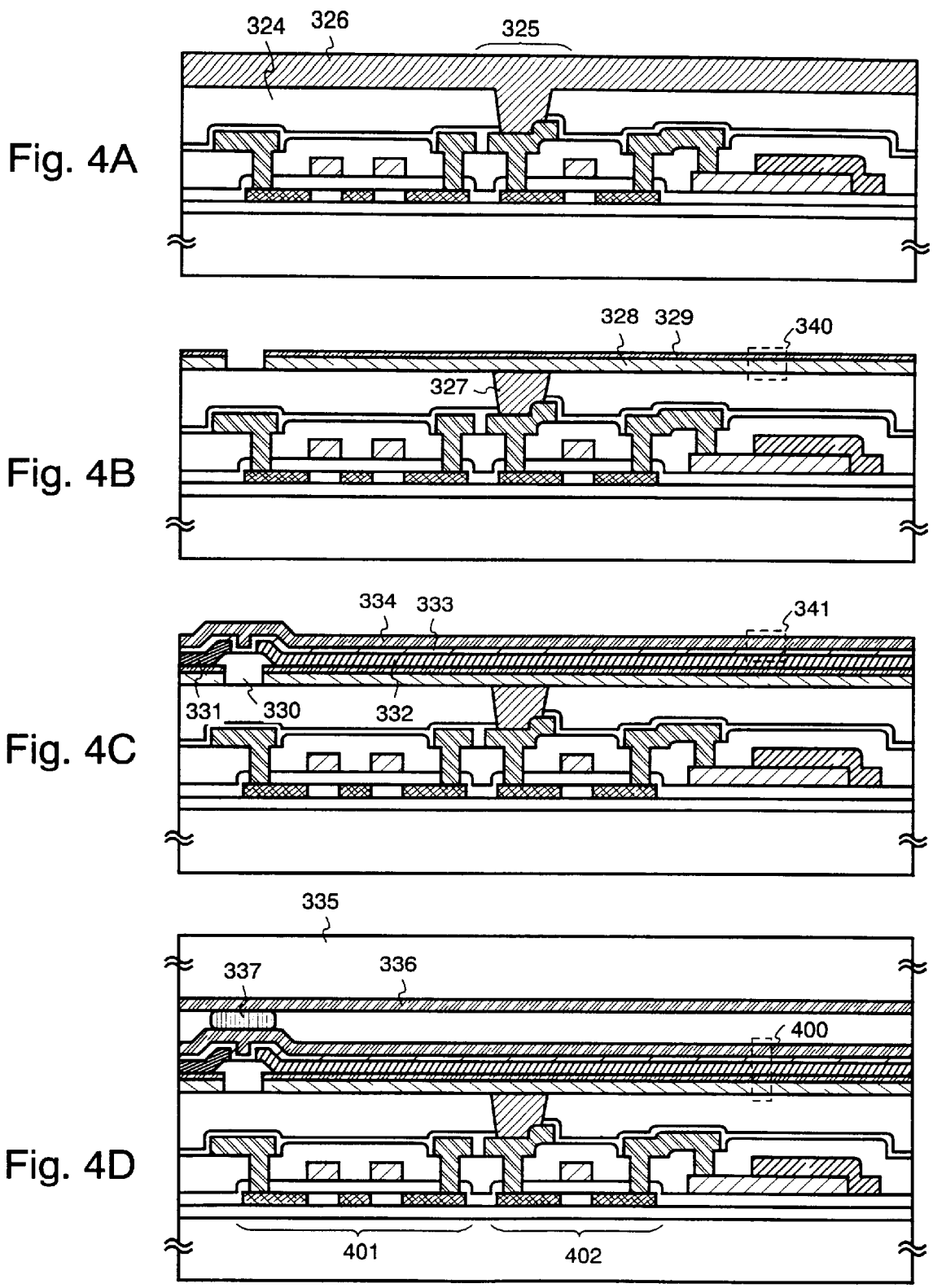

LUMINESCENT APPARATUS AND METHOD OF MANUFACTURING THE SAME

BACKGROUND OF THE INVENTION

1. Field of the Invention

This invention relates to a luminescent apparatus using a thin film made of a luminescent material, and also to an electric appliance using the luminescent apparatus as a display. An organic EL display and an organic light-emitting diode (OLED) are included in the luminescent apparatus according to the present invention.

The luminescent materials which can be used for the present invention include all luminescent materials that emit light (phosphorescence and/or fluorescence) via singlet excitation or triplet excitation or both thereof.

2. Description of the Related Art

In recent years, the development of a luminescent element (hereinafter referred to as EL element) using a thin film (hereinafter referred to as EL film) made of a luminescent material capable of obtaining EL (electroluminescence) has been forwarded. A luminescent apparatus (hereinafter referred to as EL luminescent apparatus) has an EL element having a structure in which an EL film is held between an anode and a cathode. This apparatus is adapted to obtain luminescence by applying a voltage between the positive and cathode. Especially, an organic film used as an EL film is called an organic EL film.

A metal (typically, a metal of Group I or II on the periodic table) having a small work function is used as a cathode in many cases, while a conductive film (hereinafter referred to as a transparent conductive film) transparent with respect to visible light is used as an anode in many cases. Owing to such a structure, the luminescence obtained passes through the anode, and is visually recognized.

Recently, the development of an active matrix type EL luminescent apparatus adapted to control the luminescence of an EL element provided in each image element by using a TFT (thin film transistor) has been forwarded, and a prototype thereof has come to be made public. The constructions of active matrix type EL luminescent apparatuses are shown in FIGS. 9A and 9B.

Referring to FIG. 9A, a TFT 902 is formed on a substrate 901, and an anode 903 is connected to the TFT 902. An organic EL film 904 and a cathode 905 are formed on the anode 903, and an EL element 906 including the anode 903, organic EL film 904 and cathode 905 is thereby formed.

In this luminescent apparatus, the luminescence generated in the organic EL film 904 passes through the anode 903, and is emitted in the direction of an arrow in the drawing. Therefore, the TFT 902 becomes a luminescence screening object from an observer's viewpoint, and causes an effective emission region (region in which an observer can make observation of luminescence) to be narrowed. In order to obtain a bright image when the effective emission region is narrow, it is necessary to increase an emission brightness but increasing the emission brightness results in an early deterioration of the organic EL film.

Under these circumstances, an active matrix type EL luminescent apparatus of a structure shown in FIG. 9B has been proposed. Referring to FIG. 9B, a TFT 902 is formed on a substrate 901, and a cathode 907 is connected to the TFT 902. An organic EL film 908 and an anode 909 are formed on the cathode 907, and an EL element 910 including the cathode 907, organic EL film 908 and the anode 909 are thereby formed. That is, this EL element 910 constitutes a structure directed contrariwise with respect to the EL element 906 shown in FIG. 9A.

In the luminescent apparatus of FIG. 9B, the luminescence generated theoretically in the EL film 908 passes through the anode 909, and is emitted in the direction of an arrow in the drawing. Accordingly, the TFT 901 enables the whole region, which is provided in a position which cannot be seen by an observer, and which has the electrode 907 thereon, to be used as an effective emission region.

However, the structure shown in FIG. 9B has potentially a problem that the structure is incapable of applying a uniform voltage to the anode 909. It is known that a resistance value of a transparent conductive film used generally as an anode is high as compared with that of a metallic film and can be reduced by thermally treating the transparent film. However, since the organic EL film has a low thermal resistance, a thermal treatment of over 150° C. cannot be conducted after the organic EL film has been formed.

Therefore, when an anode (transparent conductive film) is laminated on an organic EL film, a thermal treatment cannot be conducted, so that it is difficult to form an anode of a low resistance value. That is, there is a possibility that a level of a voltage applied to the anode differs at an end portion and a central portion thereof. There is a fear that this problem causes a decrease in the quality of an image.

As mentioned above, in a luminescent apparatus including a structure using a transparent conductive film formed after the formation of an organic EL film, it is difficult to reduce the resistance of the transparent conductive film.

SUMMARY OF THE INVENTION

The present invention has been made in view of the above circumstances, and it is an object of the invention to provide a luminescent apparatus capable of displaying a bright, high-quality image, and also an electric appliance using such a luminescent apparatus as a display and capable of displaying an image of a high quality. The present invention will be described with reference to FIG. 1.

According to an aspect of the present invention, the method of manufacturing a luminescent apparatus has the step of connecting an auxiliary electrode to a transparent electrode, which is provided after the formation of an organic EL film, in parallel therewith so as to substantially reduce the resistance of the transparent electrode.

Referring to FIG. 1, a reference numeral 101 denotes an insulator, 102 an electrode including a reflecting surface, 103 an organic EL layer, and 104 an electrode (hereinafter referred to as transparent electrode) transparent or translucent with respect to the visible light. On the insulator 101, an EL element formed of the electrode 102 including a reflecting surface, organic EL layer 103, and transparent electrode 104 is formed.

The phrase "transparent with respect to the visible light" means that the visible light is transmitted with a transmission factor of 80–100%. The phrase "translucent with respect to the visible light" means that the visible light is transmitted with a transmission factor of 50–80%. Although the transmission factor differs depending upon the thickness of a film, of course, the thickness of a film may be designed suitably so that the transmission factors be within the above-described range.

The insulator 101 may be formed of an insulating substrate or a substrate provided with an insulating film on a surface thereof as long as it can support the EL element.

The electrode 102 including a reflecting surface means a metallic electrode or an electrode formed of a lamination of a metallic electrode and a transparent electrode. That is, the electrode 102 means an electrode including a surface (reflecting surface) capable of reflecting the visible light on an outer surface or a rear surface thereof or an interface in the interior thereof.

The organic EL layer 103 used can be formed of an organic EL film or a laminated film of an organic EL film and a film of an organic material. That is, an organic EL film may be provided singly as a luminescent layer, or a layer of an organic material as a charge-injected layer or a charge carrying layer may be laminated on an organic EL layer as a luminescent layer. The inorganic materials include a material capable of being used as a charge-injected layer or a charge carrying layer, and a layer of such an inorganic material can also be used as a charge-injected layer or a charge carrying layer.

The transparent electrode 104 can be formed of an electrode of a transparent conductive film or an electrode of a metallic film (hereinafter referred to as a translucent metallic film) of 5–70 nm (typically, 10–50 nm) in thickness. The transparent conductive film can be formed of a conductive oxide film (typically, an indium oxide film, a tin oxide film, a zinc oxide film, a compound film of indium oxide and tin oxide, a compound film of indium oxide and zinc oxide), or a material obtained by adding gallium oxide to a conductive oxide film. When a transparent conductive film is used as the transparent electrode 104, its thickness is set to 10–200 nm (preferably 50–100 nm), and this enables the electrode to transmit the visible light with a transmission factor of 80–95%.

On the EL element 105 formed of the above-described structure, a seal member 106 and an auxiliary electrode 107 are provided, and the auxiliary electrode 107 is electrically connected to the transparent electrode 104 via anisotropic conductors 108. The anisotropic conductors 108 scattering on the transparent electrode 104 are preferably provided so that they are distributed over the whole surface thereof.

The seal member 106 is a substrate or a film transparent with respect to the visible light, and a glass substrate, a quartz substrate, a crystallized glass substrate, a plastic substrate, or a plastic film can be used. When a plastic substrate or a plastic film is used, it is preferable to provide an outer surface of a rear surface thereof with a protective film (preferably a carbon film, specifically a diamond-like carbon film) capable of preventing the passage of oxygen and water therethrough.

The auxiliary electrode 107 is an electrode provided auxiliarily for the purpose of reducing a resistance value of the transparent electrode 104, and can be made of an electrode formed of a transparent conductive film or an electrode formed of a translucent metallic film just as the transparent electrode 104. When the thickness of the auxiliary electrode 107 is set to 10–200 nm (preferably 50–100 nm) in the same manner as that of the transparent electrode 104, the auxiliary electrode can transmit the visible light with a transmission factor of 80–95%.

The anisotropic conductors 108 can be formed by using anisotropic conductive films. The anisotropic conductive film is a resin film in which conductive particles (typically metallic particles or carbon particles) are dispersed uniformly. According to the present invention, it is preferable that the anisotropic conductive films 108 be provided selectively by patterning them by photolithography, by an ink jet method, or a printing method. The reason resides in the low transmission factor of the anisotropic conductive film with respect to the visible light. Therefore, when the anisotropic conductors are provided over the whole surface of the transparent electrode 104, the light emitted from the organic EL layer 103 is absorbed thereinto.

In the luminescent apparatus including the above-described structures according to the present invention, the auxiliary electrode 107 functions as an electrode connected to the transparent electrode 104, which is formed of a transparent conductive film, in parallel therewith. Since the auxiliary electrode 107 is formed on the side of the seal member 106, a resistance value can be reduced to a low level without being restricted by the low thermal resistance of the organic EL film referred to in the descriptions of the related art examples. Therefore, when the present invention is put into practice, it becomes possible to apply a uniform voltage to the transparent electrode 104 and obtain an image of a high quality.

BRIEF DESCRIPTION OF THE DRAWINGS

Preferred embodiments of the present invention will be described in detail on the basis of the following figures, wherein:

FIGS. 3A–E are drawings showing the steps of manufacturing a luminescent apparatus;

FIGS. 4A–D are drawings showing the steps of manufacturing a luminescent apparatus;

DESCRIPTION OF THE PREFERRED EMBODIMENTS

Figure 1:
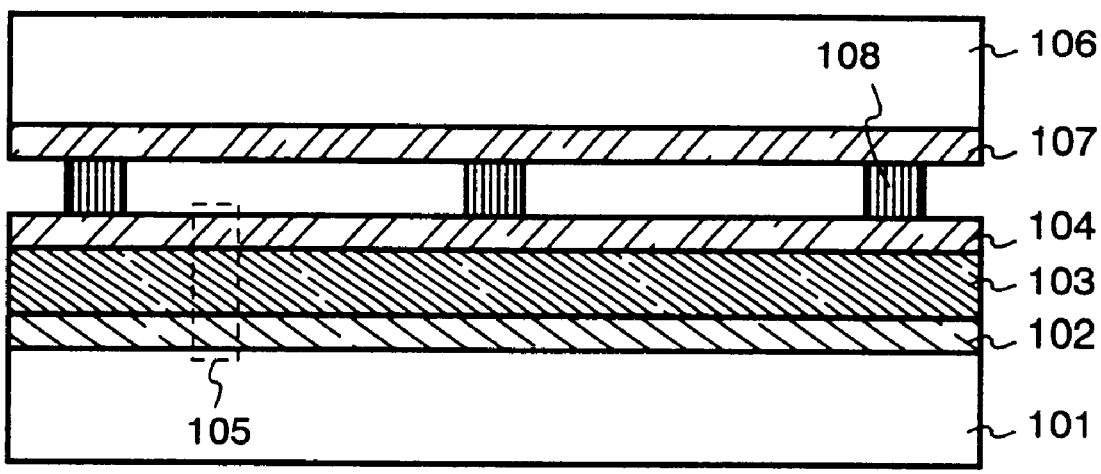
FIG. 1 is a drawing showing in section the construction of a luminescent apparatus.
Figure 2A:
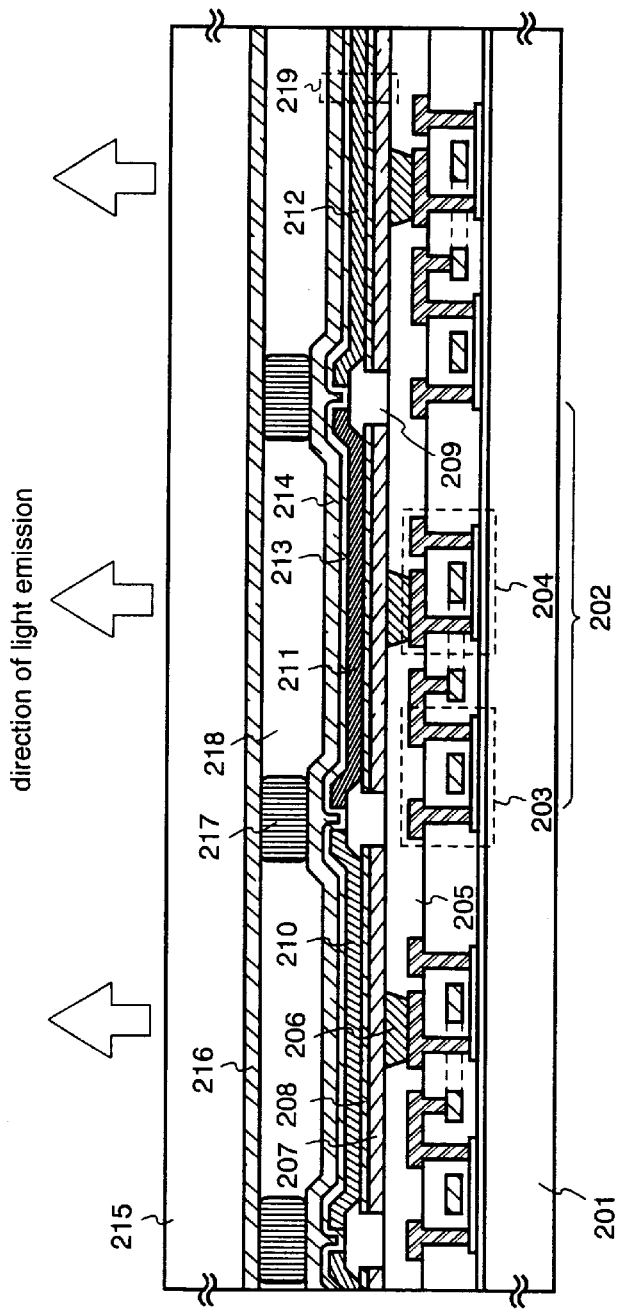
FIGS. 2A–B are drawings showing in section the construction of a luminescent apparatus.

A mode of embodiment of the present invention will now be described with reference to FIG. 2. Referring to FIG. 2, a reference numeral 201 denotes a substrate on which elements are formed. According to the present invention, any material may be used for the substrate 201. That is, glass (including quartz glass), crystallized glass, monocrystalline silicon, a ceramic material, a metal, or a plastic can be used.

A pixel 202 is formed on the substrate 201, and has a structure including a switching TFT 203 and a current control TFT 204. FIG. 2 shows three pixels emitting red, green, or blue light respectively. The switching TFT 203 functions as a switch to input video signals into the pixels, and the current control TFT 204 functions as a switch for controlling a current flowing in an EL element. In this embodiment, a drain of the switching TFT 204 is electrically connected to a gate of the current control TFT 204.

Limitations are not placed on the construction of the switching TFT 203 and current control TFT 204. A top gate type (typically, a planar type) TFT or a bottom gate type (typically, an inversely staggered type) TFT may be used. An n-channel type TFT or a p-channel type TFT may be used for both of these TFTs.

The switching TFT 203 and current control TFT 204 are covered with an inter-layer insulating film 205, to an upper portion of which a pixel electrode 207 formed of a metallic film and a drain of the current control TFT 204 are electrically connected via anisotropic conductive plugs 206. On the pixel electrode 207, a first transparent electrode 208 10–200 nm (preferably 50–100 nm) thick is laminated. In this embodiment, the pixel electrode 207 and first transparent electrode 208 form an anode 230.

This mode of embodiment employs a structure in which contact holes in which the drain of the current control TFT 204 and pixel electrode 207 are connected together are filled with anisotropic conductors. These anisotropic conductors provided so as to fill the contact holes therewith are called anisotropic conductive plugs. The anisotropic conductive plugs 206 may be formed by etching an anisotropic conductive film. Of course, the pixel electrode 207 may be connected directly to the drain of the current control TFT 204.

In recesses due to these contact holes, the coverage of the organic EL layers is poor, and there is a fear of causing short-circuiting of the cathode and the anode, so that such recesses are not desirable. In this mode of embodiment, the formation of the recesses due to the contact holes of the pixel electrode 207 can be prevented by using the anisotropic conductive plugs 206, and this enables the prevention of the occurrence of the short-circuiting of the cathode and the anode.

The pixel electrode 207 is formed preferably by using a metallic film of a high reflectance, such as an aluminum film (including an aluminum alloy film and an additive-containing aluminum film), or a thin silver film. A film formed by coating a metallic film with aluminum or silver may also be used.

A reference numeral 209 denotes insulating films (hereinafter referred to as banks) provided between portions of the anode 230, and formed so as to cover level-different portions at end sections of the anode 230. In this mode of embodiment, the provision of the banks 209 keeps the organic EL layers away from end sections of the anode 230 which are liable to give rise to field concentration, and the deterioration, which is ascribed to the field concentration, of the organic EL layers is thereby prevented. The banks 209 may be formed by using either resin films or silicon-containing insulating films (typically, a silicon oxide films).

A reference numeral 210 denotes an organic EL layer emitting red light, 211 an organic EL layer emitting green light, and 212 an organic EL layer emitting blue light. The construction of the organic EL layers 210–212 may be selectively determined with reference to known techniques.

A second transparent electrode 213 provided so as to cover the organic EL layers 210–212 is an electrode for injecting electrons into the organic EL layers. A work function of this second transparent electrode 213 is preferably 2.5–3.5 eV, and this electrode may be formed by using a metallic film containing an element belonging to Group I or II on the periodic table. In this embodiment, an alloy film (hereinafter referred to as Al—Li film) formed by coevaporating aluminum and lithium. Since the Al—Li film is a metallic film, it can be used as a transparent electrode by setting its thickness to 10–70 nm (typically, 20–50 nm).

On this second transparent electrode, a third transparent electrode 214 formed of a 100–300 nm (preferably 150–200 nm) thick transparent conductive film is provided. The third transparent electrode 214 is an electrode adapted to fulfill the function of applying a voltage to the second transparent electrode 213. In this embodiment, the second and third transparent electrodes 213, 214 form together a cathode 231.

A seal member 215 provided so as to be opposed to the substrate 201 (which is called in this embodiment a substrate including a thin film provided on the substrate 201) has an auxiliary electrode (fourth transparent electrode) 216 formed thereon which is made of a transparent conductive film 10–200 nm (preferably 50–100 nm) thick. The third transparent electrode 214 and the auxiliary electrode 216 are electrically connected together via anisotropic conductors 217 each of which is formed of an anisotropic conductive film (resin film in which metallic particles or carbon particles are dispersed).

It is preferable that the anisotropic conductors 217 be provided partially on the third transparent electrode 214. That is, it is desirable that the anisotropic conductive film be provided so as not to be superposed on at least an emission region of the pixels since this film is black or gray. When the anisotropic conductive film is used positively as a black matrix by providing the same among pixels, the optical directivity of each pixel can, of course, be improved.

The substrate 201 and seal member 215 are pasted on each other by a sealant (not shown) provided on outer edge portions of the substrate 201. When the substrate 201 and the seal member 215 are pasted on each other, a spacer (preferably 1–3 μm thick) for defining a clearance between the substrate 201 and the seal member 215 may be provided. Especially, providing the anisotropic conductors 217 so that they serve also as spacers is effective.

It is preferable that a nitrogen gas or a rare gas be sealed in a space 218 formed between the substrate 201 and the seal member 215. It is desirable to provide this space 218 with a material having a hygroscopicity or a material having deoxidization characteristics.

Figure 2B:
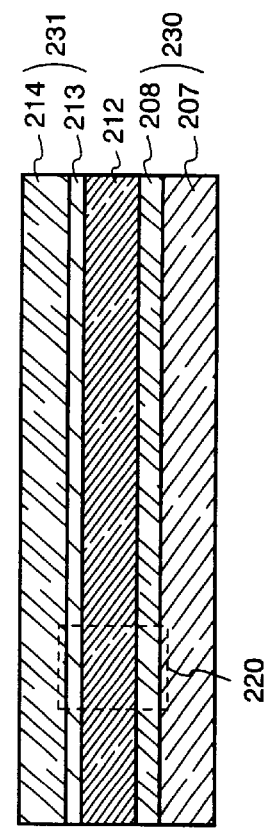

The detailed construction of a region 219 is shown in FIG. 2B. Referring to FIG. 2B, an anode 230, an organic EL layer 212, and a cathode 231 form an EL element 220. The most characteristic point of the luminescent apparatus shown in FIG. 2A resides in that the emission of light is observed through the cathode 231.

Out of the light generated in the EL element 220, the light advancing toward the anode 230 is reflected on the pixel electrode 207 having a surface of a high reflectance, and the resultant light advances toward the cathode 231. That is, the pixel electrode 207 is an electrode adapted to supply (extract electrons) a current to the anode 230, and also having a function of a reflector.

Since the second transparent electrode 213 has an extremely small thickness, a resistance value thereof is high. Therefore, a third transparent electrode 214 is laminated on the electrode 213 so as to lower the resistance value of the latter. However, since the transparent conductive film used for the third transparent electrode 214 is formed after the organic EL layer has been formed, it is difficult to lower the resistance value of the second transparent electrode. Therefore, in this mode of embodiment, the auxiliary electrode 216 made of a transparent conductive film is connected to the third transparent electrode 214, which is made of a transparent conductive film, in parallel therewith so as to substantially reduce the resistance of the third transparent electrode 214.

In the luminescent apparatus of the above-described construction, a pixel as a whole forms an effective emission region, so that a very bright image can be obtained. When the present invention is put into practice, a uniform voltage can be applied to the cathode as a whole, and this enables an image of a high quality to be obtained.

Embodiments

Embodiment 1

Figure 5A:
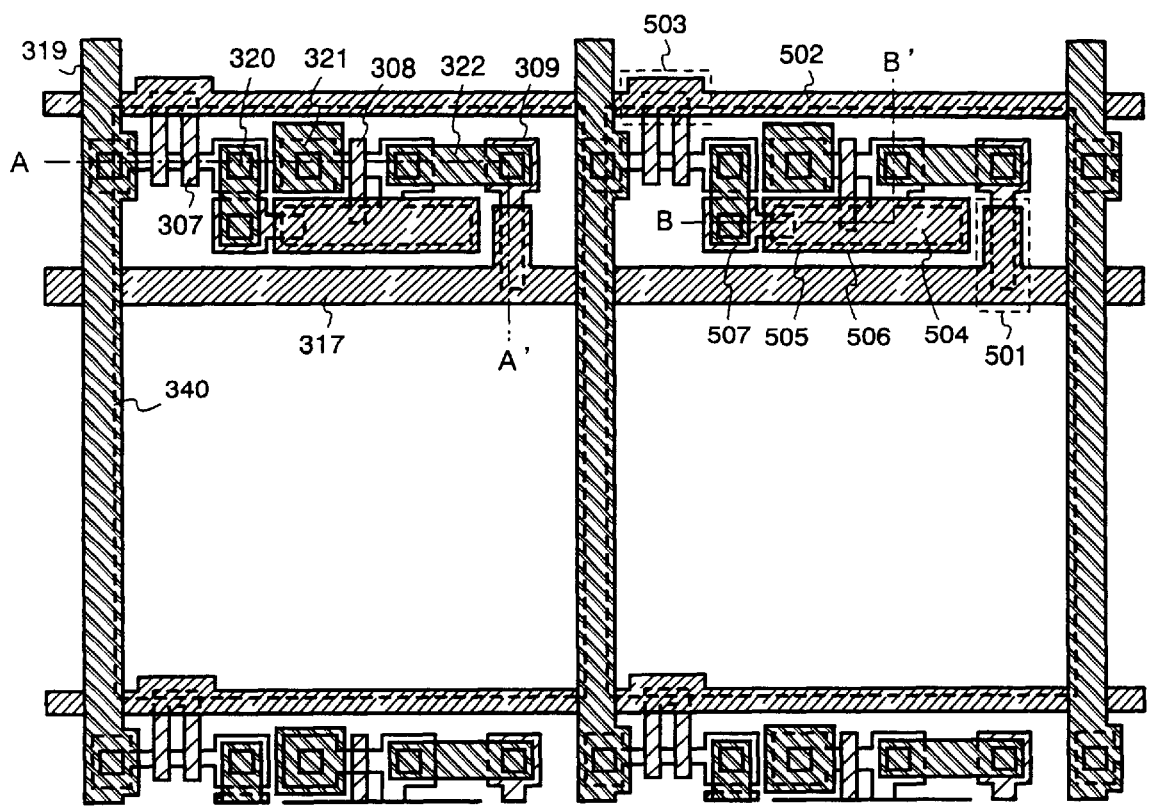
FIGS. 5A–B are drawings showing the construction of an upper surface of a pixel of a luminescent apparatus and the construction of a circuit thereof.
Figure 5B:
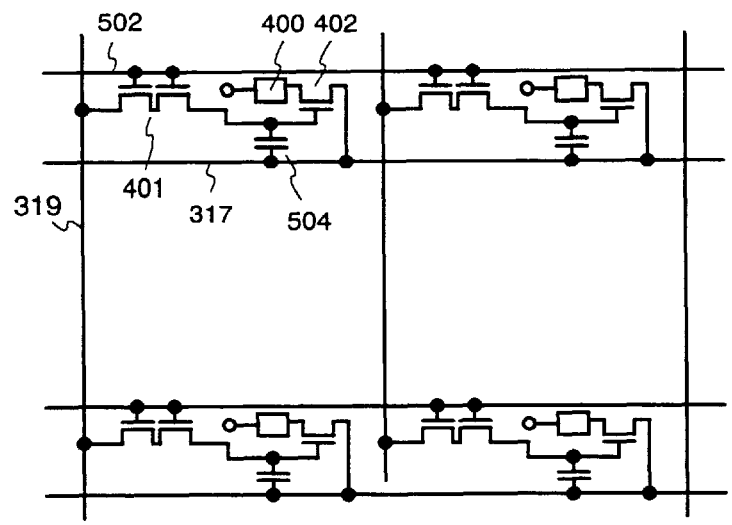

In this embodiment, the steps of manufacturing the luminescent apparatus shown in FIG. 2 will be described with reference to FIGS. 3–5. FIGS. 3 and 4 are sectional views showing the steps for manufacturing a pixel portion. A top view (of the condition at a point in time at which an anode has been just formed) of a pixel formed according to this embodiment is shown in FIG. 5A, and a circuit diagram of a final pixel in FIG. 5B. The reference numerals used in FIG. 5 correspond to those used in FIGS. 3 and 4.

First, as shown in FIG. 3A, a glass substrate 301 is prepared as a substrate, and a base film 302 made of a silicon oxide film is formed thereon to a thickness of 200 nm. The forming of the base film 302 may be done by using a low pressure thermal CVD method, a plasma CVD method, a sputtering method, or a vapor deposition method.

A crystalline silicon film 303 is then formed to a thickness of 50 nm on the base film 302. A known method can be used as a method of forming the crystalline silicon film 303. An amorphous silicon film may be laser crystallized by using a solid state laser or an excimer laser, or crystallized by a thermal treatment (furnace annealing). In this embodiment, an amorphous silicon film is crystallized by irradiation with an excimer laser beam using a XeCl gas.

Next, as shown in FIG. 3B, the crystalline silicon film 303 is patterned to form island-like crystalline films 304, 305. A gate insulating film 306 made of a silicon oxide film is formed to a thickness of 80 nm so as to cover the island-like crystalline silicon films 304, 305. Gate electrodes 307, 308 are further formed on the gate insulating film 306. According to the drawing, the gate electrode 307 is apparently formed of two separate parts but it is actually the same, bifurcated electrode.

In this embodiment, a tungsten film or a tungsten alloy film 350 nm thick is used as a material for the gate electrodes 307, 308. Other known materials can also be used, of course, as the materials for the gate electrodes. In this embodiment, a connecting wire 309 is also formed simultaneously with these gate electrodes. The connecting wire 309 is a wire for electrically connecting a source of a current control TFT and a current supply wire together later.

Next, as shown in FIG. 3C, an element (typically, boron) belonging to the 13th group of the periodic table is added by using the gate electrodes 307, 308 as masks. The adding of the element may be done by a known method. Thus, impurity regions (hereinafter referred to as p-type impurity regions) 310–314 indicative of p-type conductive type regions are formed. Just under the gate electrodes, channel-forming regions 315a, 315b, 316 are defined. The p-type impurity regions 310–314 constitute source regions or drain regions of the TFT.

The activation of the element belonging to the 13th group of the periodic table and added by conducting a thermal treatment is then carried out. The pattern formed of the island-like crystalline silicon film subjected to various steps up to this activation step is called an activated layer. This activation step may be carried out by furnace annealing, laser annealing, lamp annealing, or a combination thereof. In this embodiment, a thermal treatment is carried out at 500° C. for 4 hours in a nitrogen atmosphere.

In this activation step, it is desirable that oxygen concentration in the treatment atmosphere be set not higher than 1 ppm (preferably not higher than 0.1 ppm). The reasons reside in that, when the oxygen concentration is high, the surfaces of the gate electrodes 307, 308 and the connecting wire 309 are oxidized to cause it difficult to bring these parts into electrical contact with a gate wire and a current supply wire which are to be formed later.

It is effective that a hydrogenation treatment be carried out after the end of the activation step. The hydrogenation treatment may be conducted by using known hydrogen annealing techniques or plasma hydrogenation techniques.

As shown in FIG. 3D, a current supply line 317 is formed so that this supply line contacts the connecting wire 309. When such a structure (a top view of which is shown in a region designated by 501 in FIG. 5A) is formed, the connecting wire 309 and the current supply wire 317 are electrically connected together. During this time, a gate wire (shown in a region designated by 502 in FIG. 5A) is also formed at the same time, and electrically connected to the gate electrode 307. A top view of this structure is shown in a region designated by 503 in FIG. 5A.

In the region designated by 503, the gate wire 502 has a projecting portion, i.e., the gate wire 502 is redundantly designed so as to secure a portion which does not get over the gate electrode 307. The reason why the gate wire 502 is formed in this manner resides in that, even when the gate wire 502 is broken in the portion in which the gate wire 502 gets over the electrode 307, the electrical breakage of the gate wire 502 in the mentioned portion can be avoided. The purpose of forming the gate electrode 307 to the shape of the letter "C" is also to redundantly design the same so that a voltage is applied reliably to both electrodes.

This current supply wire 317 and the gate wire 502 are formed of a metallic film the resistance of which is lower than those of the connecting wire 309 and gate electrode 307. Preferably, a metallic film containing copper or silver may be used. That is, a metallic film of a high processability is used for a gate electrode demanding a high patterning accuracy, and a metallic film of a low specific resistance for pass lines (gate wire and current supply wire in this embodiment) demanding a low specific resistance.

After the gate wire 502 and the connecting wire 309 have been formed, a first interlayer insulating film made of a silicon oxide film is formed to a thickness of 800 nm. The forming of this film may be done by using a plasma CVD method. Some other inorganic insulating film or a resin (organic insulating film) may be used as or for the first interlayer film 318.

Next, as shown in FIG. 3E, wires 319–322 are formed by making contact holes in the first interlayer film 318. In this embodiment, metallic wires each of which is formed of a three-layer structure of titanium, aluminum, and titanium are used as the wires 319–322. Any materials may, of course, be used as long as they are in the form of conductive films. The wires 319–322 are used as source wires or drain wires of TFT.

The drain wire 322 of the current control TFT is electrically connected to the connecting wire 309. As a result, the drain of a current control TFT 402 and the current supply wire 317 are electrically connected together.

A switching TFT 401 and current control TFT 402 are completed in this condition. Although both of these TFTs are formed of a p-channel type TFT in this embodiment, both or either one of them may be formed of an n-channel type TFT.

The switching TFT 401 is formed so that the gate electrode crosses the active layer at two portions thereof, and has a structure in which two channel-forming regions are connected in series. When the TFT 401 is formed to such a structure, an off-current value (value of a current flowing when the TFT is turned off) can be reduced effectively.

Figure 6:
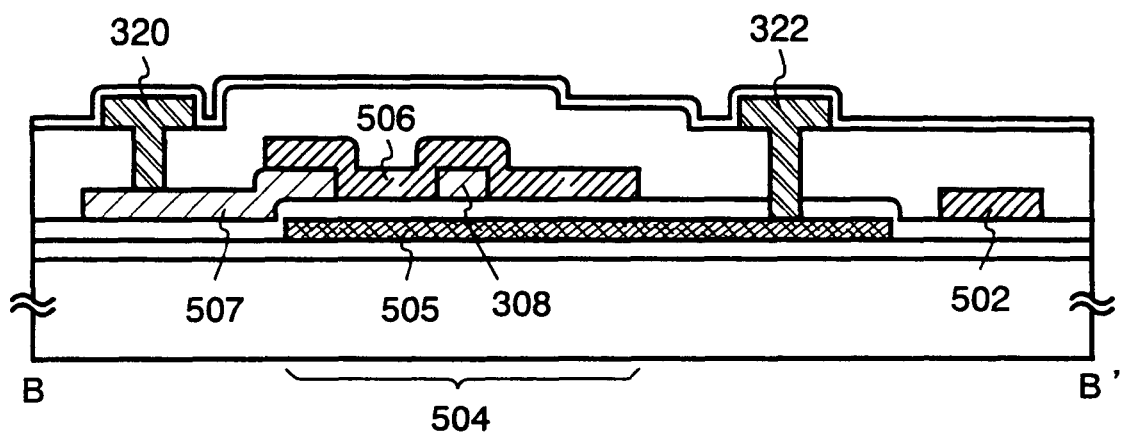
FIG. 6 is a drawing showing in section the construction of a retention capacitor.

In the pixel, a holding capacitor 504 is formed as shown in FIG. 5A. A sectional view (taken along a line B–B' in FIG. 5A) of the holding capacitor 504 is shown in FIG. 6. The holding capacitor 504 is formed of a semiconductor layer 505 electrically connected to the drain of the current control TFT 402, the gate insulating film 306 and a capacitor wire 506. That is, the semiconductor layer 505 and a capacitor wire 506 are insulated by the insulating film 306, and form a capacitor (holding capacitor).

The capacitor wire 506 is formed simultaneously with the gate wire 502 and current supply wire 317, and serves also as a wire for electrically connecting the gate electrode 308 and connecting wire 507 together. The connecting wire 507 is electrically connected to the drain wire (which functions as a source wire in some cases) 320 of the switching TFT 401.

The advantage of the holding capacitor shown in this embodiment resides in that the capacitor wire 506 is formed after the active layer has been formed. That is, since the semiconductor layer 505 constitutes a p-type impurity region in the case of this embodiment, it can be used as it is as an electrode.

After the wires 319–322 are formed, a passivation film 323 made of a silicon nitrogen film or a nitrided silicon oxide film is formed to a thickness of 200 nm. When a hydrogenation treatment is conducted before or after this passivation film 323 is formed, the electric characteristics of the TFT can be improved.

As shown in FIG. 4A, a layer of an acrylic resin is then formed to a thickness of 1 μm as a second interlayer insulating film 324. After a contact hole 325 is made, an anisotropic conductive film 326 is formed. In this embodiment, a layer of an acrylic resin in which silver particles are dispersed is used as the anisotropic conductive film 326. It is desirable that the anisotropic conductive film 326 be formed to such a sufficient thickness that permits flattening the contact hole 325. In this embodiment, the anisotropic conductive film 326 is formed to a thickness of 1.5 μm by a spin coating method.

The anisotropic conductive film 326 is then etched with plasma using an oxygen film. This process is continued until the second interlayer insulating film 324 is exposed. When the etching of the film 326 finishes, an anisotropic conductor plug 327 shown in FIG. 4B comes to be formed. When the second interlayer insulating film 324 is exposed, a height difference occurs in some cases in the anisotropic conductor plug 327 with respect to the second interlayer insulating film 324, due to a difference in etching rate therebetween but, when the height difference is not larger than 100 nm (preferably not larger than 50 nm), it does not raise any special problem.

After the anisotropic conductor plug 327 is formed, an aluminum film to which scandium or titanium is added and an ITO film (compound film of indium oxide and tin oxide) are accumulated thereon. The resultant product is subjected to etching to form a pixel electrode 328 made of an aluminum film to which scandium or titanium is added and a first transparent electrode 329 made of an ITO film. In this embodiment, the pixel electrode 328 and the first transparent electrode 329 constitute an anode 340.

In this embodiment, the thickness of the aluminum film is set to 200 nm, and that of the ITO film 100 nm. The ITO film can be etched with ITO-04N (commercial name of the etching solution for ITO films, manufactured by the Kanto Kagaku Co., Ltd.), and the aluminum film by a dry etching method using a gas obtained by mixing carbon tetrachloride ($SiCl_4$) and chlorine ($Cl_2$).

A sectional view of FIG. 4B of the structure thus obtained corresponds to that of the structure taken along a line A–A' in FIG. 5A.

Next, as shown in FIG. 4C, an insulating film 330 is formed as a bank. Although, in this embodiment, the bank 330 is formed by using an acrylic resin, it can also be formed by using a silicon oxide film. After the bank 330 has been formed, a surface treatment for the first transparent electrode 329 is conducted by applying ultraviolet light thereto in an oxygen atmosphere. This treatment has an effect in increasing a work function of the first transparent electrode 329, and, furthermore, an effect of removing contaminants from the surface thereof.

Organic EL films 331, 332 are then formed to a thickness of 50 nm respectively. The organic EL film 331 is an organic EL film emitting blue light, and the organic EL film 332 an organic EL film emitting red light. An organic EL film (not shown) emitting green light is also formed at the same time. In this embodiment, the organic EL films are formed separately for each pixel by using an evaporation method using a shadow mask. It is a matter of course that the separate formation of the organic EL films can also be carried out by suitably choosing a printing method and an ink jet method.

In this embodiment, an example using each of the organic EL films 331, 332 as a single layer is shown. A laminated structure using CuPc (copper phthalocyanine) as a hole injection layer is also effective. In this case, first, a copper phthalocyanine film is formed on the whole surface, and an organic EL film emitting red light, an organic EL film emitting green light, and an organic EL film emitting blue light are then formed for respective pixels corresponding to red, green, and blue colors.

When a green organic EL film is formed, $Alq_3$ (tris-8-quinolinolatoaluminum complex) is used, and quinacridone or coumarin 6 is added as a dopant. When a red organic EL film is formed, $Alq_3$ is used as a matrix material for the organic EL film, and DCJT, DCM1 or DCM2 is added as a dopant. When a blue organic EL film is formed, $Balq_3$ (5-configuration complex having a mixing ligand for 2-methyl-8-quinolinol and a phenol derivative) is used, and perylene is added as a dopant.

According to the present invention, the organic EL film is not, of course, required to limit to the above-mentioned organic EL film. A known low molecular weight organic EL film and a high polymer organic EL film can be used. When a high polymer organic EL film is used, a coating method (spin coating method, an ink jet method, or a printing method) can also be used.

After the organic EL films 331, 332 are thus formed, a MgAg film (metallic film obtained by adding 1–10% silver (Ag) to magnesium (Mg)) of 20 nm in thickness is formed as a second transparent electrode 333, and, furthermore, an ITO film of 250 nm in thickness as a third transparent electrode 334. In this embodiment, the second and third transparent electrodes 333, 334 constitute a cathode 341.

An EL element 400 made of the anode 340, organic EL film 331 (or organic EL film 332), and cathode 341 is formed. In this embodiment, this EL element functions as a luminescent element.

Next, as shown in FIG. 4D, an auxiliary electrode 336 made of a transparent conductive film is formed to a thickness of 250 nm on the seal member 335, and an anisotropic conductor 337 made of an anisotropic conductive film on the third transparent electrode 334. The substrate 301 and seal member 335 are pasted on each other by using a seal material (not shown).

The pasting step is carried out in an argon atmosphere. As a result, argon is sealed in a space 338. A gas used for sealing may, of course, be any gas as long as it is an inert gas, and a nitrogen gas or a rare gas may be used. It is preferable that the space 338 be filled with a material absorbing oxygen or water thereinto. It is also possible to fill the space with a resin.

A switching TFT (p-channel type TFT in this embodiment) 401 and a current control TFT (p-channel type TFT in this embodiment) 402 are formed by the above-described manufacturing steps. Since all TFTs in this embodiment are formed of p-channel type TFT, the manufacturing steps are very simple.

The height-different portions are flattened by the second interlayer insulating film 324, and the drain wire 321 of the current control TFT 402 and the pixel 328 are electrically connected together by using the anisotropic plug 327 buried in the contact hole 325, so that the flatness of the anode 340 is high. Accordingly, the uniformity of the thickness of the organic EL film 332 can be improved, and this enables the emission of light from the pixels to become uniform.

Embodiment 2

In this embodiment, an EL luminescent apparatus having pixels the structure of which is different from that of the pixels of the EL luminescent apparatus shown in FIG. 2 will be described with reference to FIG. 7. The embodiment of FIG. 7 can be manufactured by only slightly modifying the structure of FIG. 2, and will be described with attention paid to the points of the former embodiment which are different from the corresponding points of the latter embodiment. Therefore, concerning the parts of the embodiment of FIG. 7 which are designated by reference numerals identical with those used in FIG. 2, the statement under "Description of the Preferred Embodiment" may be referred to.

Figure 7:
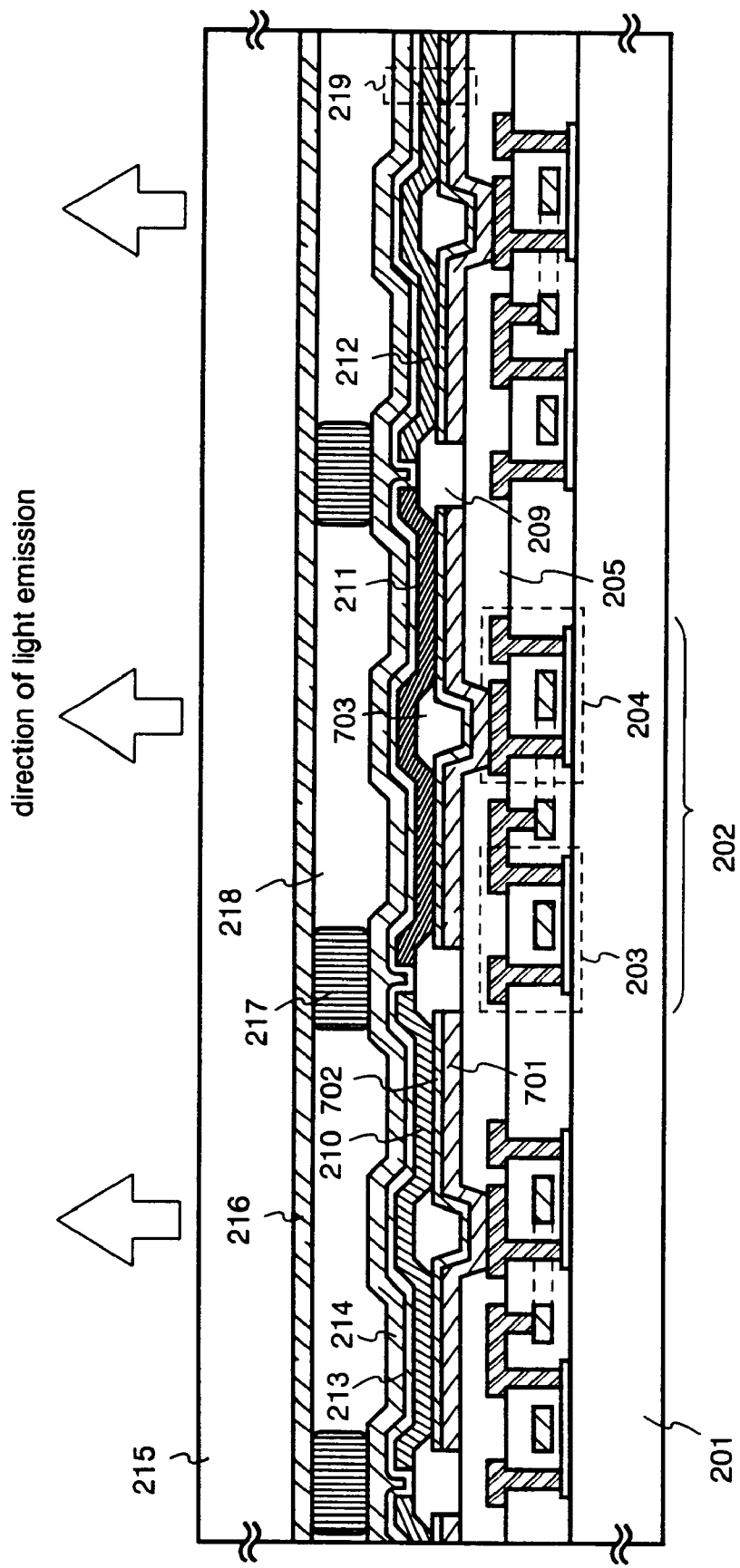
FIG. 7 is a drawing showing in section the construction of a luminescent apparatus.

In the embodiment of FIG. 7, contact holes are formed in an interlayer insulating film 205, and a pixel electrode 701 and a first transparent electrode 702 are thereafter formed in the same condition, an insulating film 703 being then formed so as to fill recessed portions due to contact holes therewith. In this embodiment, the insulating film 703 is called a filling insulating film. Since the filling insulating film 703 can be formed simultaneously with banks 209, it does not cause the number of the manufacturing steps to be increased in particular.

This filling insulating film 703 is formed for the purpose of preventing just as the anisotropic conductor plugs 206 of FIG. 2 the occurrence of short-circuiting of the cathode and the anode ascribed to the recessed portions made of the contact holes. During the formation of the filling insulating film 703, a height measured from an upper surface thereof to that of the second transparent electrode 702 is preferably set to 100–300 nm. When this height exceeds 300 nm, it causes the short-circuiting of the cathode and anode to occur in some cases. When this height becomes not larger than 100 nm, there is a possibility that the effect (effect in holding down the influence of electric field concentration in edge portions of the pixel electrode) of the banks 209, which is formed simultaneously with the insulating film 703, lowers.

In this embodiment, a layer of an acrylic resin is formed to a thickness of 500 nm by a spin coating method after the second transparent electrode 702 has been formed. The layer of acrylic resin is then etched with an oxygen gas turned into plasma, until the thickness of this layer (the portions of the layer in which the contact holes are not provided) amounts to 200 nm. After the thickness of the film is thus reduced, the banks 209 and the filling insulating films 703 are formed by carrying out a patterning operation.

Figure 8:
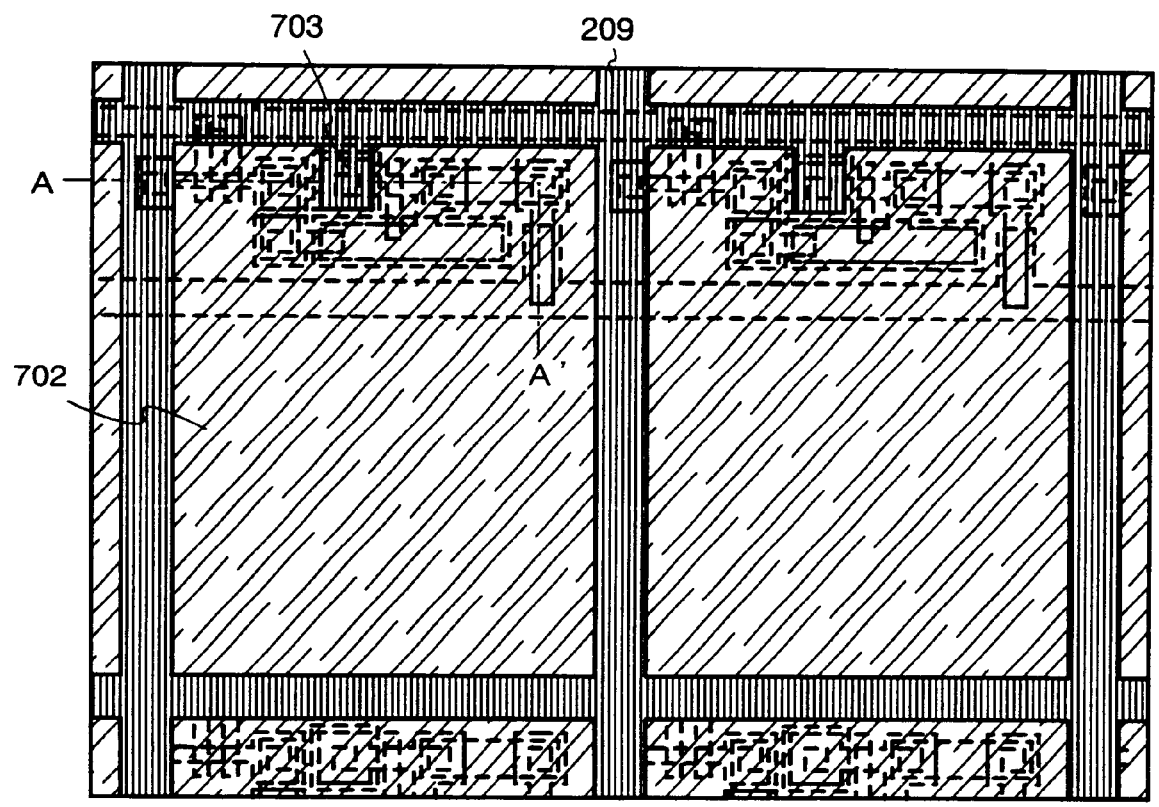
FIG. 8 is a drawing showing the construction of an upper surface of the luminescent apparatus.
Figure 9A:
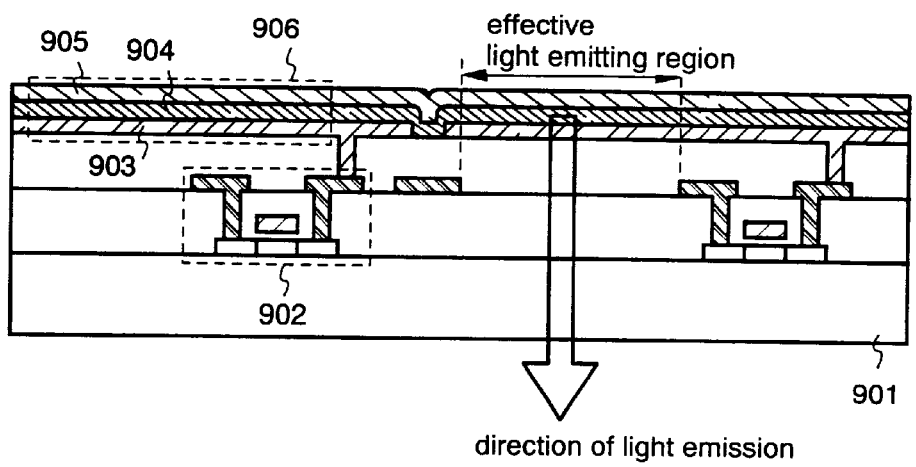
FIGS. 9A–B are drawings showing in section the construction of related art luminescent apparatuses.
Figure 9B:
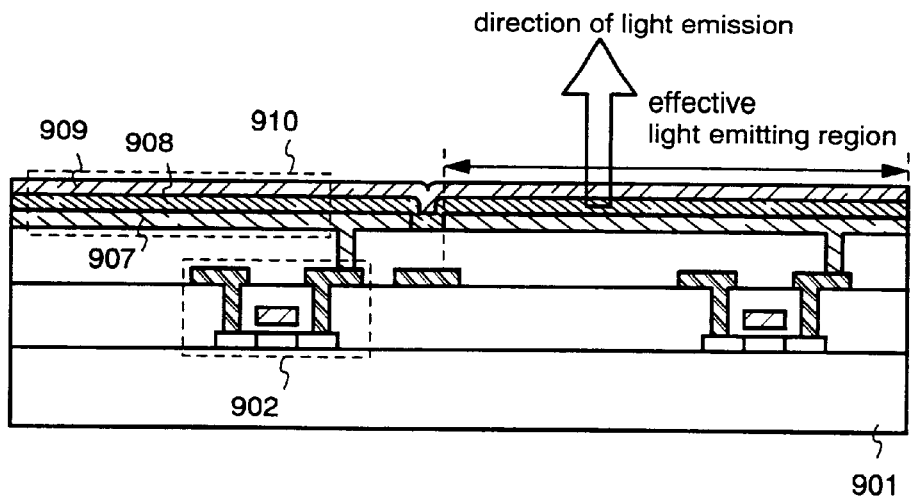

The construction of an upper surface of a pixel in this embodiment is shown in FIG. 8. Referring to FIG. 8, a sectional view taken along a line A–A' corresponds to FIG. 7. In FIG. 8, a seal member 215 and an anisotropic conductor 217 are not shown. Since a basic pixel structure is identical with that of FIG. 5, a detailed description thereof is omitted.

As shown in FIG. 8, the bank 209 is formed so as to hide a difference in height between edge portions of the picture electrode 701 and the anode 702, and the filling insulating film 703 is formed by projecting parts of the bank 209. This projecting insulating film has a structure filling the recessed portions made of the contact holes of the pixel electrodes 701.

The EL luminescent apparatus in this embodiment can be manufactured easily by combining the above method of forming the filling insulating film with the manufacturing method of Embodiment 1.

Embodiment 3

Although only the construction of pixels is shown in the EL luminescent apparatuses shown in the mode of embodiment and Embodiment 1, a circuit for driving the pixels may be formed in a body on the same substrate. In this case, the driving circuit can be formed of an nMOS circuit, a pMOS circuit, or a CMOS circuit. It is, of course, allowable to form the pixel portions alone of TFTs, and use an externally fixed driving circuit, typically, an IC tip-including driving circuit (TCP and COG).

In Embodiment 1, the pixel portions are formed by p-channel type TFTs only, and the number of the manufacturing steps are thereby reduced. In this case, it is also possible to form the driving circuit by a pMOS circuit, and use an IC tip-including driving circuit as a driving circuit unable to be formed by a pMOS.

The structure of this embodiment can be put into practice by freely combining the same with the structure of Embodiment 1 or 2.

Embodiment 4

In this embodiment, an example using an amorphous silicon film as an active layer of switching TFTs and current control TFTs formed in pixel portions is shown. An inversely staggered TFT is known as a TFT using an amorphous silicon film, and can also be used in this embodiment.

Although a step of manufacturing a TFT using an amorphous film is simple, a size of an element becomes large. In the EL luminescent apparatus according to the present invention, the size of TFT does not have influence upon the effective emission surface area. Therefore, a more inexpensive EL luminescent apparatus can be manufactured by using an amorphous silicon film as an active layer.

The structure of this embodiment can be put into practice by freely combining with any of those of Embodiments 1–3. However, when the structure of Embodiment 4 is combined with that of Embodiment 3, it is difficult to manufacture a driving circuit of a high operating speed by a TFT using an amorphous silicon film. Therefore, it is desirable to externally fix an IC tip-including driving circuit to the structure.

Embodiment 5

In Embodiments 1–4, active matrix type EL luminescent apparatuses were described. The present invention can also be put into practice with respect to an EL element of a passive matrix type EL luminescent apparatus.

The structure of this embodiment can be put into practice by freely combining the same with any of those of Embodiments 1–3. However, when the structure of Embodiment 5 is combined with that of Embodiment 3, an IC tip-including driving circuit is necessarily fixed to an outer portion of the structure.

Embodiment 6

A luminescent apparatus formed by putting into practice the present invention can be used as a display of various kinds of electric appliances. The displays formed by inserting a luminescent apparatus in a casing include all information displays, such as a display for personal computers, a display for receiving a TV broadcast and a display for advertisement.

The electric appliances besides above to which the present invention can be applied include a video camera, a digital camera, a goggle type display (head mounting display), a navigation system, a music reproducer (car audio and an audio component), a note type personal computer, a game machine, a portable information terminal (mobile computer, a portable telephone, a portable game machine, or an electronic book), and an image reproducer (apparatus adapted to reproduce an image recorded on a recording medium, and an apparatus provided with a display for showing the image).

As mentioned above, the range of application of the present invention is very wide, and the present invention can be used for electric appliances in all fields. The electric appliances in this embodiment may use a luminescent apparatus of any structures shown in Embodiments 1–6.

The present invention is characterized in that an electrode made of a transparent conductive film provided on a seal member is electrically connected, by using an anisotropic conductive film, to an electrode made of a transparent conductive film formed after an organic EL film is formed. This enables a resistance value of the transparent conductive film formed after the organic EL film is formed to be substantially reduced, and a uniform voltage to be applied to a transparent electrode.

According to the present invention, a luminescent apparatus having a greatly increased effective emission surface area of pixels and reproducing a bright high-quality image can be obtained by employing a structure which has a transparent or translucent cathode and a reflecting electrode under an EL element, and which is adapted to take out the light to the side of the cathode. An electric appliance using the luminescent apparatus according to the present invention as a display and reproducing an excellent image can also be obtained.

What is claimed is:

1. A luminescent apparatus comprising:
   a substrate;
   a first electrode having a reflective surface formed over the substrate;
   an organic electro luminescence layer formed over the first electrode;
   a transparent electrode formed over the organic electro luminescence layer;
   a plurality of conductive layers disposed separately over each other, and formed on the transparent electrode; and
   an auxiliary electrode formed over the plurality of conductive layers,
   wherein the auxiliary electrode is electrically connected to the transparent electrode via the plurality of conductive layers.

2. A method of manufacturing a luminescent apparatus according to claim 1, wherein the auxiliary electrode is formed of a transparent conductive film.

3. A luminescent apparatus comprising:
   a substrate;
   a first electrode having a reflective surface over the substrate;
   an organic electro luminescence layer over the first electrode;
   a transparent electrode over the organic electro luminescence layer;
   an anisotropic conductor over the transparent electrode; and
   an auxiliary electrode formed over the anisotropic conductor and electrically connected to the transparent electrode via the anisotropic conductor.

4. A method of manufacturing a luminescent apparatus according to claim 3, wherein the auxiliary electrode is formed of a transparent conductive film.

5. A luminescent apparatus according to claim 3, wherein the anisotropic conductor comprises a resin in which conductive particles are dispersed.

6. A luminescent apparatus comprising:
   a substrate;
   a switching TFT formed over the substrate;
   a current control TFT electrically connected to the switching TFT;
   a first electrode having a reflective surface formed over the current control TFT;
   an organic electro luminescence layer formed over the first electrode;
   a transparent electrode formed over the organic electro luminescence layer;
   an anisotropic conductor formed over the transparent electrode; and
   an auxiliary electrode formed over the anisotropic conductor and electrically connected to the transparent electrode via the anisotropic conductor.

7. A method of manufacturing a luminescent apparatus according to claim 6, wherein the auxiliary electrode is formed of a transparent conductive film.

8. The luminescent apparatus according to claim 6, wherein the anisotropic conductor comprises a resin in which conductive particles are dispersed.

9. A luminescent apparatus comprising:
   an electro luminescence element comprising an electrode having a reflective surface, a transparent electrode and an organic electro luminescence layer interposed therebetween;
   an auxiliary electrode electrically connected to the transparent electrode via an anisotropic conductor,
   wherein the electrode having a reflective surface is formed by laminating a metallic film and a transparent conductive film on each other and the transparent electrode is formed by laminating a translucent metallic film and a transparent conductive film on each other.

10. A luminescent apparatus according to claim 9, wherein the translucent metallic film has a thickness of 5–70 nm.

11. A luminescent apparatus according to claim 9, wherein said a luminescent apparatus is an apparatus selected from the group consisting of a personal computer, a TV, a video camera, a digital camera, a goggle type display, a navigation system, a music reproducer and game machine.

12. A luminescent apparatus according to claim 9, wherein the auxiliary electrode is formed of a transparent conductive film.

13. A luminescent apparatus according to claim 9, wherein the anisotropic conductor comprises a resin in which conductive particles are dispersed.

14. A luminescent apparatus according to claim 9, wherein an organic electro luminescence layer is provided in contact with the transparent conductive film included in the electrode having a reflective surface and the translucent metallic film.

15. A luminescent apparatus according to claim 14, wherein the translucent metallic film has a thickness of 5–70 nm.

16. A method of manufacturing a luminescent apparatus comprising the steps of:
forming a reflecting surface-including electrode on an insulator,
forming an organic electro luminescence layer on the reflecting surface-including electrode, forming a transparent electrode on the organic electro luminescence layer,
forming an anisotropic conductor on the transparent electrode,
forming an auxiliary electrode on a seal member, and
pasting the insulator and seal member on each other so that the anisotropic conductor and auxiliary electrode are connected together,
wherein the reflecting surface-including electrode is formed by laminating a metallic film and a transparent conductive film on each other and the transparent electrode is formed by laminating a translucent metallic film and a transparent conductive film on each other.

17. A method of manufacturing a luminescent apparatus according to claim 16, wherein a thickness of the translucent metallic film is set to 5–70 nm.

18. A method of manufacturing a luminescent apparatus according to claim 16, wherein the auxiliary electrode is formed of a transparent conductive film.

19. A luminescent apparatus comprising:
a plurality of pixels, each of the plurality of pixels comprising:
at least one thin film transistor over a substrate;
a first electrode having a reflective surface over the substrate and electrically connected to the at least one thin film transistor; and
an organic electro luminescence layer over the first electrode,
a transparent electrode over the plurality of pixels;
an anisotropic conductor over the transparent electrode; and
an auxiliary electrode over the anisotropic conductor and electrically connected to the transparent electrode via the anisotropic conductor.

20. A luminescent apparatus according to claim 19, wherein the anisotropic conductor comprises a resin in which conductive particles are dispersed.

21. A method of manufacturing a luminescent apparatus according to claim 19, wherein the auxiliary electrode is formed of a transparent conductive film.

* * * * *